United States Patent
Taracila et al.

(10) Patent No.: US 9,213,072 B2
(45) Date of Patent: Dec. 15, 2015

(54) RADIO-FREQUENCY TRAPS AND METHODS OF COMMON-MODE ENERGY DAMPING

(75) Inventors: Victor Taracila, Beachwood, OH (US); Miguel Angel Navarro, Sheffield Village, OH (US); Fraser Robb, Aurora, OH (US); Pei H. Chan, Aurora, OH (US)

(73) Assignee: General Electric Company, Schenectady, NY (US)

(*) Notice: Subject to any disclaimer, the term of this patent is extended or adjusted under 35 U.S.C. 154(b) by 783 days.

(21) Appl. No.: 13/492,481

(22) Filed: Jun. 8, 2012

(65) Prior Publication Data

US 2013/0328565 A1    Dec. 12, 2013

(51) Int. Cl.
 *G01R 33/36* (2006.01)

(52) U.S. Cl.
 CPC ......... *G01R 33/3685* (2013.01); *Y10T 29/4984* (2015.01)

(58) Field of Classification Search
 CPC ..................... G01R 33/3685; Y10T 29/4984
 See application file for complete search history.

(56) References Cited

U.S. PATENT DOCUMENTS

| 5,028,868 | A * | 7/1991 | Murata et al. ............ 324/207.2 |
| 5,137,677 | A * | 8/1992 | Murata ................... 264/272.16 |
| 5,326,981 | A * | 7/1994 | Hara et al. ............... 250/492.21 |
| 7,292,038 | B2 | 11/2007 | Doty |
| 8,035,384 | B2 | 10/2011 | Saha |
| 2006/0232354 | A1 | 10/2006 | Gilliland |
| 2006/0290448 | A1 | 12/2006 | Wynn et al. |
| 2009/0315642 | A1 | 12/2009 | Evers et al. |
| 2010/0019767 | A1 | 1/2010 | Cho et al. |
| 2010/0102817 | A1 | 4/2010 | Saha |
| 2010/0301862 | A1 | 12/2010 | Tropp et al. |
| 2011/0140700 | A1 | 6/2011 | Taracila et al. |
| 2011/0267061 | A1 * | 11/2011 | Taracila et al. ............... 324/322 |

OTHER PUBLICATIONS

Seeber et al., "Floating Radio Frequency Balun for Suppression of Shield Currents", Proceedings of the International Society for Magnetic Resonance in Medicine, ISMRM, pp. 2377, Jun. 26, 2013.
Unofficial English Translation of Netherlands Search Report and Written Opinion issued in connection with corresponding NL Application No. 2010847 on Mar. 30, 2015.

* cited by examiner

*Primary Examiner* — Dixomara Vargas
(74) *Attorney, Agent, or Firm* — Dean D. Small; The Small Patent Law Group, LLC

(57) ABSTRACT

Radio-frequency (RF) traps and methods of common-mode energy damping are provided. One RF trap includes a body and a shutter holder rotatably coupled within the body, wherein the shutter holder is configured to rotate within the body about a longitudinal axis. The RF trap further including a magnetic flux shutter coupled to the shutter holder, wherein the magnetic flux shutter rotates within the body with the shutter holder to align the magnetic flux shutter at an angle within the body.

21 Claims, 9 Drawing Sheets

RADIO-FREQUENCY TRAPS AND METHODS OF COMMON-MODE ENERGY DAMPING

BACKGROUND OF THE INVENTION

The subject matter disclosed herein relates generally to radio-frequency (RF) traps, such as for damping transmission line common-modes in Magnetic Resonance Imaging (MRI) systems.

Electric (E) fields generated by a system can induce currents and voltages that interfere with the operation of the system. For example, MRI systems include a magnet, such as a superconducting magnet that generates a temporally constant (i.e., uniform and static) primary or main magnetic field. MRI data acquisition is accomplished by exciting magnetic moments within the primary magnetic field using radio-frequency RF coils. For example, in order to image a region of interest, the magnetic gradient coils are energized to impose a magnetic gradient to the primary magnetic field. RE transmit coils are then pulsed to create RF magnetic field pulses in a bore of an MRI scanner in order to acquire MR images of the region of interest using, for example, a phased array of RE receiver coils. The resultant image that is generated shows the structure and function of the region of interest.

In MRI systems, the RE coils, besides generating the RF magnetic fields needed for MRI, also generate E fields that induce currents and voltages within transmission lines (e.g., coaxial cables) connected to the one or more RF transmit (e.g., body) or receive coils. These induced voltages and currents, such as common-mode currents can interfere with the operation of the MRI system, such as with the tuning and matching of the RE coils in the MRI system. In order to suppress or dampen these induced modes, one or more cable RF traps, also commonly referred to as balanced-unbalanced networks (baluns), are typically connected in series with cables in the MRI system to provide common-mode energy damping or blocking. In these MRI systems, the cable RF traps are tuned to the system frequency. The blocking impedance at this frequency depends on the inductance and resistance of the trap. Conventional RF traps are usually tuned with a variable capacitor to reach a maximum impedance. However, variable capacitors are costly and typically have a low breaking voltage rating.

BRIEF DESCRIPTION OF THE INVENTION

In accordance with various embodiments, a radio-frequency (RF) trap is provided that includes a body and a shutter holder rotatably coupled within the body, wherein the shutter holder is configured to rotate within the body about a longitudinal axis. The RF trap further includes a magnetic flux shutter coupled to the shutter holder, wherein the magnetic flux shutter rotates within the body with the shutter holder to align the magnetic flux shutter at an angle within the body.

In accordance with other embodiments, a magnetic resonance imaging (MRI) system is provided that includes an imaging portion having at least one transmit coil, a processing portion and a system interface interconnecting the imaging portion and the processing portion, wherein the system interface is connected to the at least one transmit coil with at least one transmission line. The MRI system further includes a radio-frequency (RF) trap positioned adjacent the at least one transmission line. The RF trap includes a body and a shutter holder rotatably coupled within the body, wherein the shutter holder is configured to rotate within the body about a longitudinal axis. The RF trap also includes a magnetic flux shutter coupled to the shutter holder, wherein the magnetic flux shutter rotates within the body with the shutter holder to align the magnetic flux shutter at an angle within the body to dampen currents induced along the at least one transmission line.

In accordance with yet other embodiments, a method for providing a magnetic flux shutter arrangement includes providing a shutter holder and securing a magnetic flux shutter within the shutter holder. The method also includes positioning the shutter holder within a housing to allow rotational movement of the magnetic flux shutter therein.

DETAILED DESCRIPTION OF THE INVENTION

Figure 1:
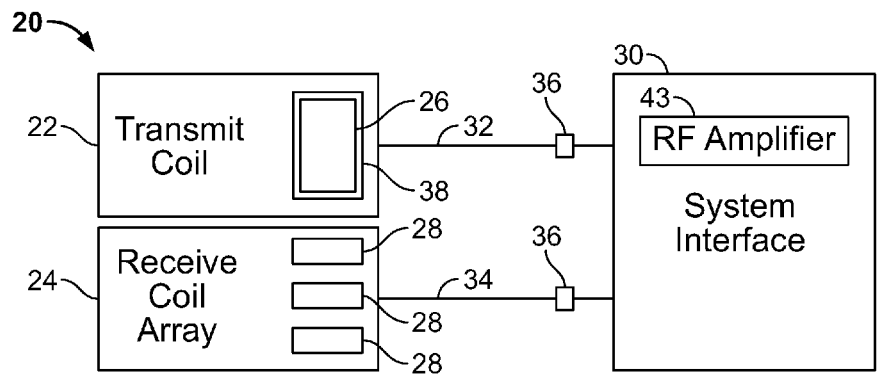
FIG. 1 is a block diagram of a transmit/receive section of a Magnetic Resonance Imaging (MRI) system having radio-frequency (RF) traps in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for varying a capacitance of a trap, such as a radio-frequency (RF) trap that may be used, for example, in a Magnetic Resonance Imaging (MRI) system. RF traps in accordance with various embodiments are provided using a magnetic flux shutter and without variable capacitors. For example, in some embodiments, an RF trap (also referred to as a balanced-unbalanced network (balun)) is positioned adjacent or in proximity to a transmission line within the MRI system, such as coaxial cables connected to MRI coils (e.g., RF transmit and/or receive coils), to dampen or block common-mode energy, such as common-mode currents and voltages.

It should be noted that although various embodiments are described in an RF electric (E) field environment, such as may be present in an MRI system environment, the various embodiments may be implemented in connection transmission lines that are in magnetic environments, as well as non-magnetic environments. In general, the various embodiments may be implemented in an environment where E fields are generated that can induce currents and/or voltages in transmission lines within that environment.

As illustrated in FIG. 1, various embodiments may be implemented in connection with a transmit/receive section 20 of an MRI system. The transmit/receive section 20 is configured to acquire MR data using one or more coils or coil arrays, illustrated as a transmit coil 22 and a receive coil array 24. The transmit coil 22 includes a single RF coil 26 and the receive coil array 24 includes a plurality of individual RF coils 28. For example, in one embodiment, the transmit coil 22 is an RF body coil, such as an RF birdcage coil. The RF body coil may be used as a whole-body RF coil. For a whole-body RF coil, the dimensions of the RF body coil are configured so that the RF body coil may be installed inside a superconducting magnet assembly or inside the bore of the MRI system. In some embodiments, the transmit coil 22 or the receive coil array 24 may be a local coil (e.g., a head coil or knee coil). It should be noted that the RF coil 26 and/or the RF coils 28 may be mounted on one or more coil formers (not shown). It also should be noted that in some embodiments, one or more individual or single receive RF coils 28 are provided instead of or in addition to the receive coil array 24.

The transmit coil 22 and receive coil array 24 are coupled to a system interface 30. In operation, the transmit coil 22 is configured to transmit RF pulses and the receive coil array 24 is configured to detect the MR signals, such as from a patient. In some embodiments, only a single coil array is provided, such that the coil array is configured to transmit RF pulses and also detect MR signals from the patient. It should be noted that an RF shield 38 may be provided around the transmit coil 22 to prevent the RF fields from penetrating the gradient coils (not shown) on the outside of the transmit coil 22, for example, on the outside of the body coil.

One or more connections or links are used to connect the transmit coil 22 and receive coil arrays 24 to the system interface 30. For example, in one embodiment, one or more transmission lines, such as coaxial cable 32 and 34 connect the transmit coil 22 and receive coil array 24 to the system interface. It should be noted that single coaxial cables 32 and 34 are shown interconnecting the transmit coil 22 and receive coil array 24 with the system interface 30 for simplicity. However, in various embodiments, multiple coaxial cables 32 and/or 34 may be used, such as depending on the number of coils used, the number of channels, etc.

It also should be noted that a plurality of different coil arrangements may be provided, for example, to image different portions of the patient. It also should be noted that the transmission lines are not limited to the coaxial cable 32 and 34, but may be any type of transmission line, for example, a stripline or microstripline.

The various embodiments also include one or more RF traps 36 that are positioned along one or more regions or points of the transmission lines, such as the coaxial cables 32 and 34 to dampen or block common-mode energy. For example, one or more RF traps 36 (one is shown in combination with each of the coaxial cable 32 and 34 for simplicity) may be positioned adjacent to the coaxial cable 32 and 34 as described in more detail herein, which may be provided in an abutting arrangement (e.g., the RF traps 36 encircle the coaxial cables 32 and 34). Thus, the RF traps 36 may be configured as a "bazooka" RF trap or RF trap sleeve is some embodiments. The RF traps 36 in these embodiments encircle the coaxial cable 32 and 34 such that external cable currents (e.g., sheath currents) encounter the impedance of the RF trap 36. Thus, the RF traps 36 dampen or block currents and/or voltages induced in the coaxial cable 32 or 34 by an E field generated by power (RF signals) supplied to the transmit coil 22 by an RF amplifier 43. The E field generated by a body RF transmit coil during a transmit pulse may be several 1000 V/m, thus resulting in a large inhomogeneous E field. As described in more detail below, induced energy, such as induced currents and/or voltages that generate unwanted frequencies are dampened or blocked.

Figure 2:
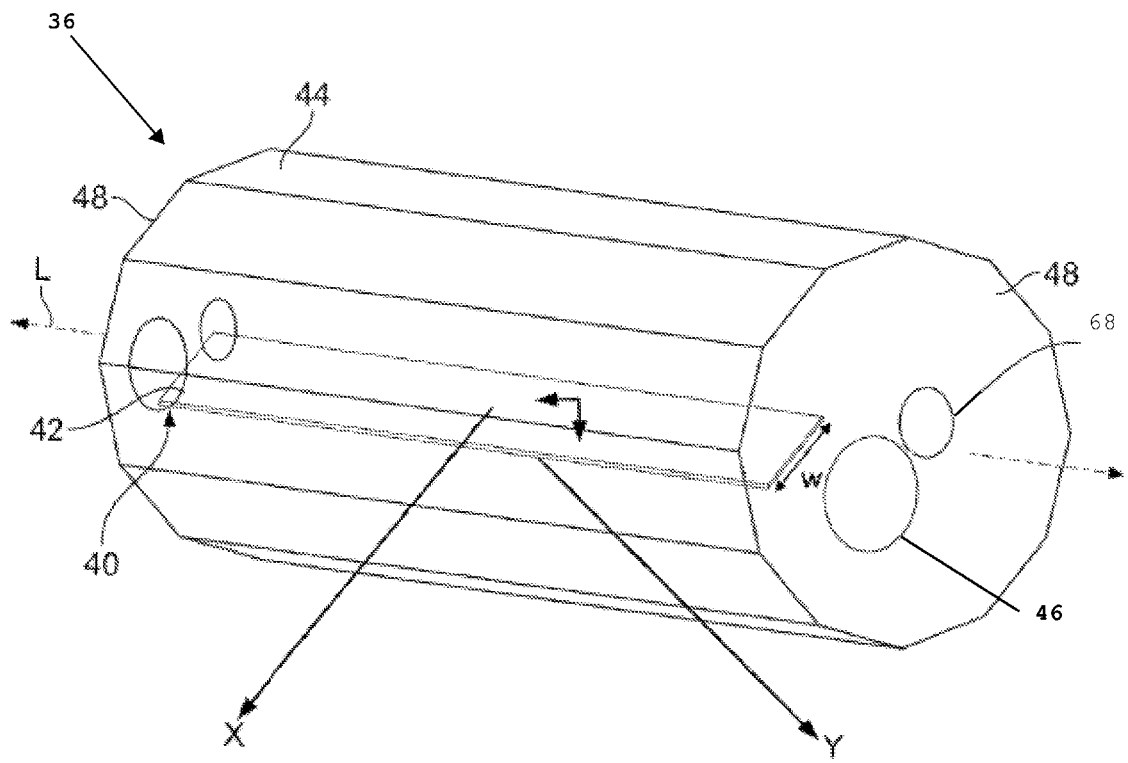
FIG. 2 is a diagram illustrating an RF trap formed in accordance with an embodiment.

Various embodiments provide one or more RF traps 36 such as shown in FIG. 2. The RF trap 36 is configured to provide a variable inductance using a magnetic flux shutter arrangement as described in more detail below. In particular, various embodiments provide a configuration that allows for varying the capacitance of the RF trap 36 to thereby adjust the inductance. For example, the positioning of a magnetic flux shutter 40 of the RF trap 36 may be adjusted such that the magnetic flux shutter is positioned perpendicular to magnetic flux lines to block, for example, induced current flow on an outer surface of the transmission lines 32 and 34 (shown in FIG. 1). In particular, the orientation of the magnetic flux shutter 40 within the RF trap 36 may be varied such that the impedance is changed based on an opening angle of the magnetic flux shutter 40. It should be noted that the RF trap 36 in some embodiments is coupled to the coaxial cable 32 or 34. However, in other embodiments, the RF trap 36 may not be coupled to the coaxial cable 32 or 34 such that a floating RF trap arrangement is provided.

In the illustrated embodiment, the magnetic flux shutter 40 is embodied as a metallic strip 42 positioned within a body 44 of the RF trap 36. For example, in one embodiment the metallic strip 42 is a rectangular metal trace, such as formed from copper. However, other metallic materials may be used. Additionally, the thickness of the metallic strip 42 may be determined based on the amount of induced current to be blocked. The metallic strip 42 is movable within the body 44, and more particularly, within a cavity 46 within the body 44. The cavity 46 may extend longitudinally through all or a portion of the body 44. The metallic strip 42 is movably coupled within the cavity 46 to allow rotation about a central longitudinal axis (L) of the cavity 46. It should be noted that the cavity 46 may be formed offset from a central longitudinal axis of the body 44. For example, the cavity 46 may be formed within the body 44 such that the cavity 46 is not centered within the diameter or outer circumference of the body 44.

In some embodiments, the metallic strip 42 is permanently inserted within the body 44. Thus, the metallic strip 42 is not readily removable from the cavity 46. As used herein, the term "permanently" when used to modify "couple," "engage," "mount," "insert" or "secure" means the components may not be readily separated without destroying or significantly damaging either component. Two components are readily separable in various embodiments when the components can be separated without significant effort and within a reasonable period of time for its intended use.

The metallic strip 42 extends along a portion of the cavity 46 between ends 48 of the body 44. It should be noted that the metallic strip 42 may extend along all or only a portion of the cavity 46 between the ends 48. Thus, the metallic strip 42 may extend from one end 48 to an opposite end 48 of the cavity 46 or from one end 48 to an intermediate location between the ends 48. In some embodiments, the metallic strip 42 may extend between, but not to either of the ends 48.

The metallic strip 42 is illustrated as planar metal strip. However, the metallic strip 42 may take other shapes and configurations. Additionally, although the cavity 46 is illustrated as cylindrical, the cavity 46 may also have a different shape and size. In various embodiments, the diameter of the cavity 46 is slightly larger than the width (W) of the metallic strip 42 to allow rotation within the cavity 46. It should be noted that the width (W) of the metallic strip 42 may be varied, such as to provide different ranges of tuning for the RF trap 36.

Additionally, as described in more detail below, a support and rotating mechanism is also provided within the cavity 46 to support the metallic strip 42 in a fixed position along the cavity 46 while allowing rotation along the longitudinal axis (L). Accordingly, the shape and size of the hole may be provided to accommodate the metallic strip 42 and the support and rotating mechanism.

The body 44 of the RF trap 36 also may be sized and shaped differently. Accordingly, although the body 44 is illustrated as having a polygonal outer circumference, the body 44 may have cylindrical or other shaped outer circumference. Additionally, in various embodiments the body 44 may be formed from any non-metallic material. For example, in one embodiment the body 44 may be formed from plastic, such as a molded plastic. The body 44 also may be formed as a single unitary piece or may be formed from multiple pieces coupled together (e.g., two plastic halves affixed together). In some embodiments, the body is molded to include the cavity 46 therein. In other embodiments, a bore is provided through the body 44, such as by drilling, to form the cavity 46 therein.

Figure 3:
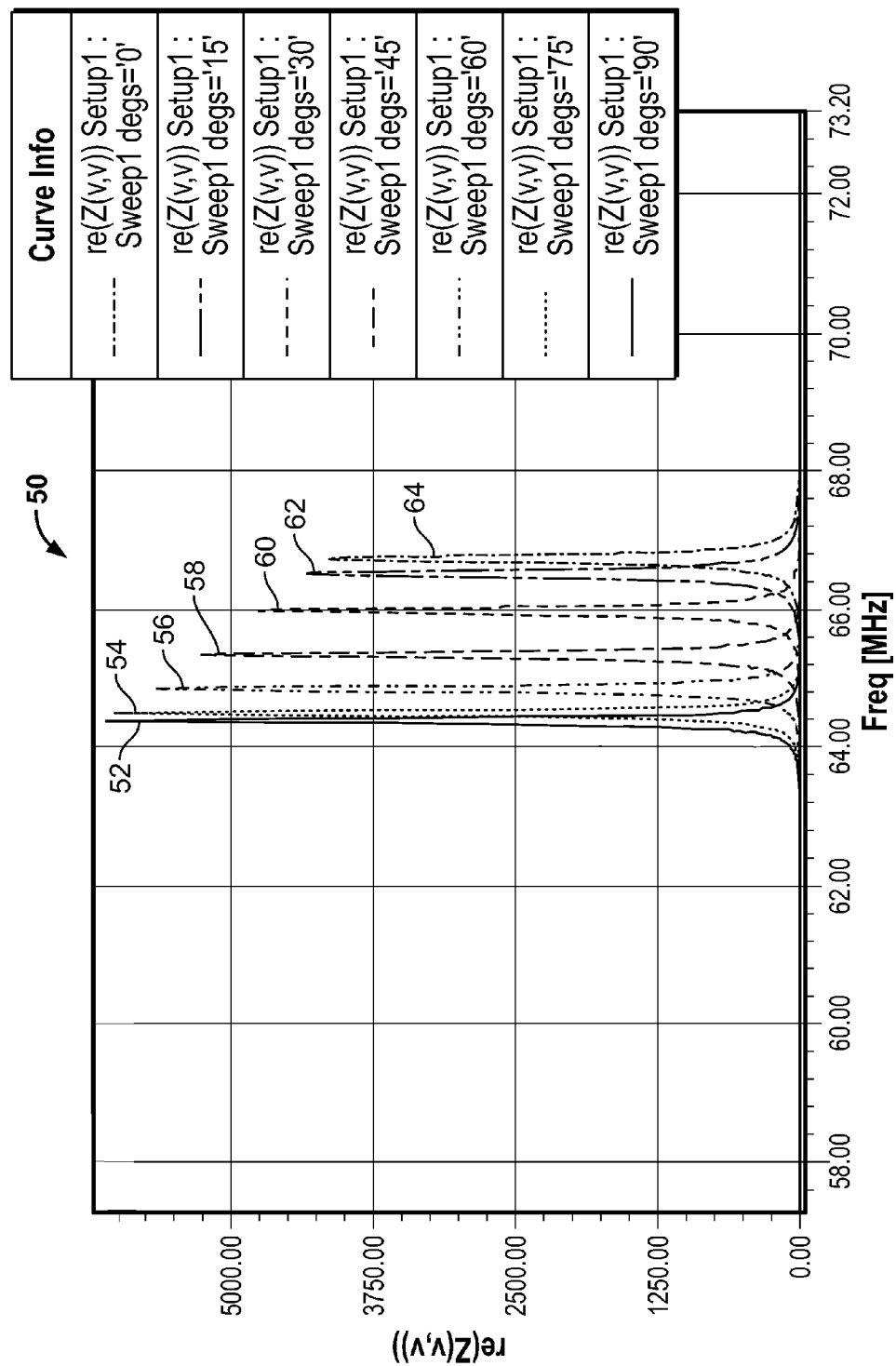
FIG. 3 is a graph illustrating impedance versus an angle of a magnetic flux shutter formed in accordance with various embodiments.
Figure 4:
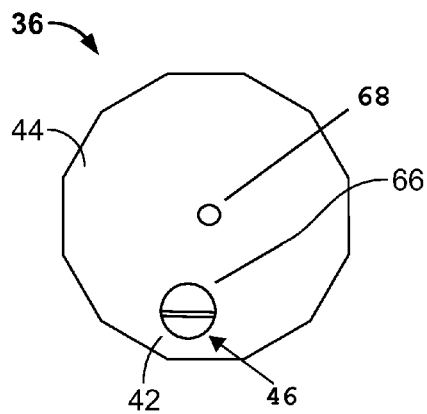
FIGS. 4 and 5 are diagrams illustrating movement of a magnetic flux shutter in accordance with various embodiments.
Figure 5:
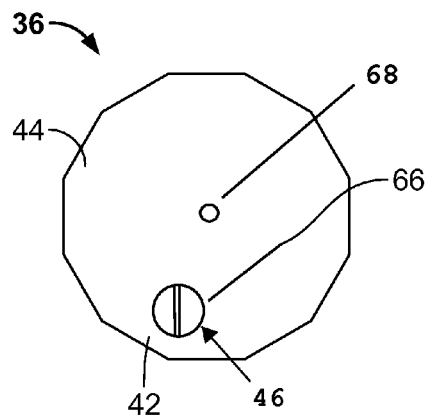

In operation, by rotating the metallic strip 42 within the cavity 46, the impedance of the RF trap 36 may be varied. For example, the graph 50 shown in FIG. 3 illustrates impedance versus opening angle of the metallic strip 44 for the RF trap 36, wherein the horizontal axis corresponds to frequency and the vertical axis corresponds to resistance in Ohms. As can be seen by the curves 52, 54, 56, 58, 60, 62, 64, corresponding to shutter angles of 0 degrees, 15 degrees, 30 degrees, 45 degrees, 60 degrees, 75 degrees and 90 degrees (relative to the transmission line), respectively, by rotating the metallic strip 42, the resistance is changed, which also varies the impedance. For example, the metallic strip 42 is shown in an open shutter position in FIG. 4 and a closed shutter position in FIG. 5. As can been seen, the metallic strip 42 may be rotated within the cavity 46 from a generally horizontal position as shown in FIG. 4 to a generally vertical position as shown in FIG. 5 (as viewed in these Figures). It should be noted that in various embodiments the metallic strip 42 is allowed to rotate 180 degrees within the cavity 46. Additionally, the rotation may be from any start and ending position within the cavity 46.

In FIGS. 4 and 5, the metallic strip 42 is provided within a shutter holder 66 that defines a support and rotating mechanism. For example, the shutter holder 66 may be a cylindrical plastic member having a recess for receiving and securing the metallic strip 42 therein. For example, the shutter holder 66 may include a notch or channel that is sized and shaped complementary to the metallic strip 42 for receiving the metallic strip 42 therein. The metallic strip 42 may be fixedly coupled within the recess such that the longitudinal or axial alignment of the metallic strip 42 within the cavity 46 is maintained while allowing rotation thereof within the cavity 46.

In the illustrated embodiment of FIGS. 4 and 5, the cavity 46 is shown as not centered within the body 44. Accordingly, the central longitudinal axis of the cavity 46 is not aligned with the central longitudinal axis of the body 44. It should be noted that the offset of the cavity 46 within the body 44 may be provided in any direction and at any distance from the center of the body 44. It also should be noted that the metallic strip 42 is shown for illustration purposes only and in various embodiments the metallic strip 42 is contained entirely within the body 44 and not visible.

Figure 6:
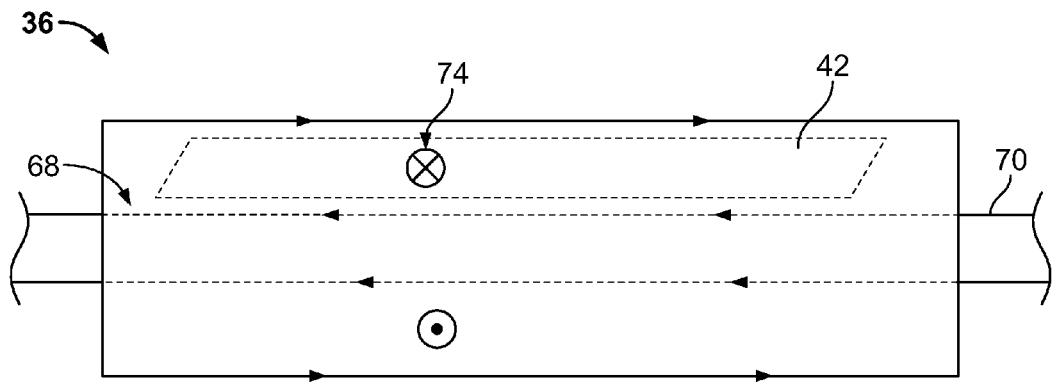
FIG. 6 is a diagram illustrating induced currents and a magnetic field along a transmission line.
Figure 7:
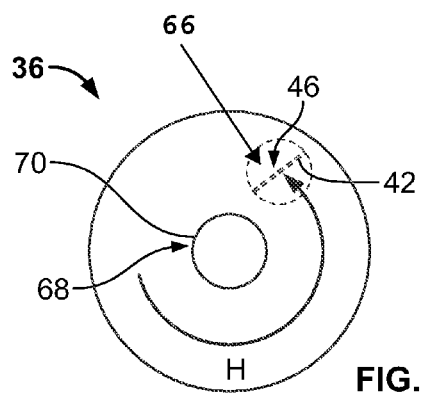
FIG. 7 is a diagram illustrating blocking of a magnetic field in accordance with various embodiments.

In operation, the metallic strip 42 is rotated to block a magnetic field and reduce or prevent induced currents from flowing along an outside of the transmission line (e.g., the transmission lines 32 and 34 shown in FIG. 1). For example, as shown in FIG. 6, E fields may generate current flow (illustrated by the arrows) along an outer surface 72 of a transmission line, illustrated as a coaxial cable 70. The moving electric currents (having moving electric charges) produce a magnetic field 74, in particular, an H field (illustrated by the H arrow in FIG. 7) around the coaxial cable 70. In accordance with various embodiments, the RF trap 36 is adjusted such that the magnetic flux shutter, illustrated as the metallic strip 42 is positioned to block the magnetic H field by varying the inductance, which includes rotating the metallic strip 42 within the body 44 of the RF trap 36 to a particular shutter position. For example, as shown in FIG. 7, the metallic strip 42 is rotated within the cavity 46 such that the width of the metallic strip 42 is positioned generally perpendicular to the H field. Accordingly, induced currents along the outside of the coaxial cable 70 are dampened. As can be seen in FIGS. 6 and 7, the cavity 46 may extend longitudinally within the body adjacent and generally parallel to the coaxial cable 70, which may extend through another opening 68 through the body 44.

Variations and modifications are contemplated. For example, an RF trap 80 may be provided as illustrated in FIGS. 8-11, which may be used alternatively or in addition to the RF traps 36, for example, in combination with the transmission lines 32 and 34 (shown in FIG. 1). In this embodiment, the RF trap 80 may be configured for positioning adjacent a stripline or microstripline transmission line. The RF trap 80, similar to the RF trap 36 allows for rotation of the metallic strip 42 therein. The RF trap 80 is formed as a multi-piece design wherein a body 82 is formed from a cover 84 and a base 86 that may be coupled together to secure the metallic strip 42 therein. The cover 84 and base 86 may be removably secured together or fixedly or permanently secured together (to prevent or resist opening thereof). Accordingly, in some embodiments, a snap-fit type of connection or similar arrangement may be provided between the cover 84 and base 86. However, in other embodiments, the cover 84 and base 86 may be permanently secured together, such as with an adhesive.

The cover 84 is configured to secure to the base 86 to enclose a channel 88 therein. For example, the cover 84 may include a cavity 90 to receive therein the base 86. The base 86 generally includes an end wall 92 that engages within a notch 94 at an end of the cover 84 when secured together to form a closed end. The base also includes tabs 87 that are received within complementary openings within the cover 84 to provide secure engagement therebetween. The cover 84 also includes within the cavity 90 a channel 96 therein that extends longitudinally along the RF trap 80. The channel 96 is complementary to the channel 88 such that when the base 86 is secured to the cover 84, the two channels 88 and 96 form a cylindrical cavity for receiving therein a shutter holder 98. The shutter holder 98 when inserted within the cylindrical cavity formed by the two channels 88 and 96 maintains the metallic strip 42 along the longitudinal axis and allows only rotation thereof.

The shutter holder 98 is sized and shaped to be inserted and maintained within the cylindrical cavity formed by the two channels 88 and 96. In the illustrated embodiment, the shutter holder 98 is a two-piece configuration having a rotatable member 100 including a recess, such as a cutout or channel for receiving therein the metallic strip 42. A cover 104 is also provided for securing to the rotatable member 100 such that the metallic strip 42 is provided within the shutter holder 98. For example, the cover 104 in the illustrated embodiment has a semi-cylindrical shape such that when the cover 104 is secured to the rotatable member 100, the shutter holder 98 has a cylindrical body that is sized and shaped to be received within the cavity formed by the two channels 88 and 96. The components of the shutter holder 98, including the rotatable member 100 and the cover 104, along with the metallic strip 42 may be secured together using an adhesive or may be positioned in an abutting arrangement and positioned within the RF trap 80 without adhesive coupling.

Figure 9:
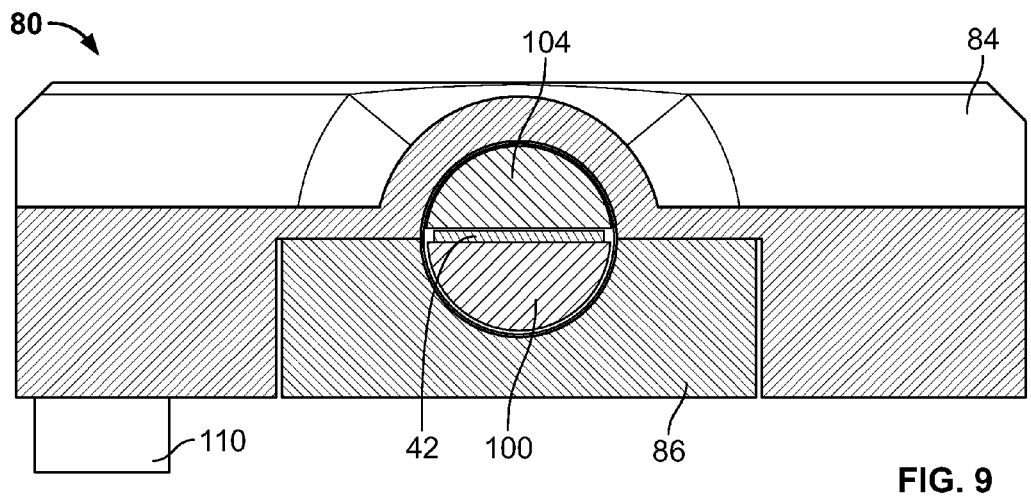
FIGS. 9-11 are diagrams illustrating movement of a magnetic flux shutter of the RF trap of FIG. 8.
Figure 10:
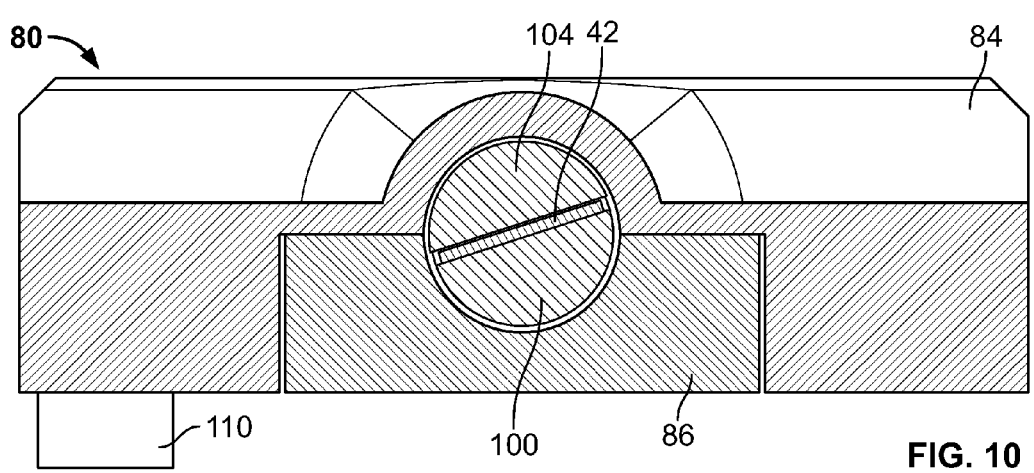
Figure 11:
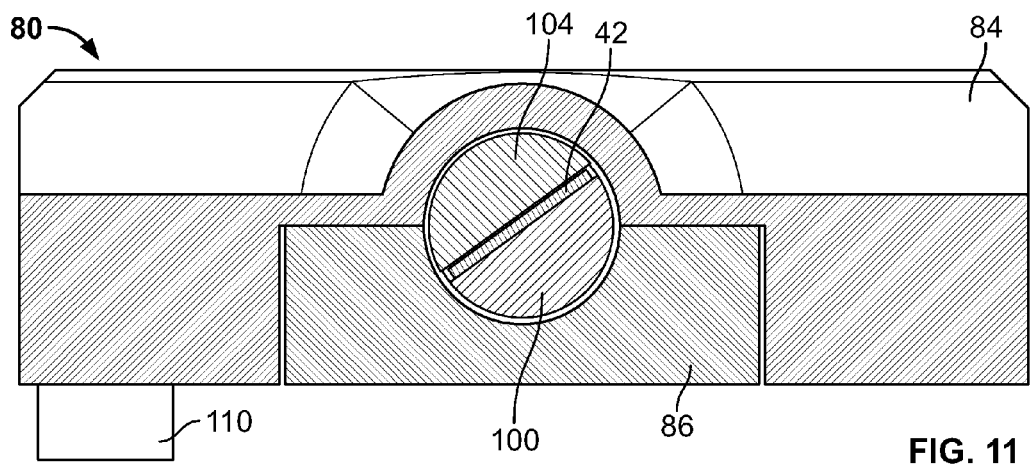

Thus, as shown in FIGS. 9-11, the shutter holder 98 is maintained within the cavity formed by the two channels 88 and 96 when the base 86 and cover 84 are secured together. For example, the shutter holder 98 may be positioned within the channel 88 of the base 86 with the cover 84 secured thereto. The cover 84 and base 86 also include complementary annular grooves 106, such that when the shutter holder 98 is positioned within the base 86 and cover 84, an annular flange 108 of the rotatable member 100 is received within the annular grooves 106. In operation, the engagement of the annular flange 108 within the annular grooves 106 maintains the shutter holder 98 aligned within the cavity formed by the two channels 88 and 96, namely prevents axial movement of the shutter holder 98 along the longitudinal axis of the RF trap 80. However, this arrangement allows for rotational movement of the shutter holder 98 to position the metallic strip 42 at different angles within the RF trap 80.

For example, as shown in FIG. 9, the shutter holder 98 may be rotated such that the metallic strip 42 is in a neutral or open position (shown as generally horizontal in FIG. 9). It should be noted that the metallic strip 42 is shown for illustration in FIGS. 9-11. However, the metallic strip 42 is concealed within the RF trap 80 by the ends of the rotatable member 100. The RF trap 80 may include an engagement tab 110 that in the illustrated embodiment protrudes or extends from the cover 84 past the base 86. In various embodiments, the engagement tab 110 is configured to engage the RF trap 80 with a transmission line, for example, a stripline or microstripline positioned in abutting arrangement with a bottom of the RF trap 80 (as viewed in FIG. 9).

As can be seen in FIGS. 10 and 11, the shutter holder 98 may be rotated to rotate the metallic strip 42 to different angles (with FIG. 11 showing more rotation than FIG. 10), which may be determined based on the magnetic H-field generated by a transmission line. For example, as described in more detail herein, the metallic strip 42 may be rotated to block the magnetic H-field of transmission line.

Figure 8:
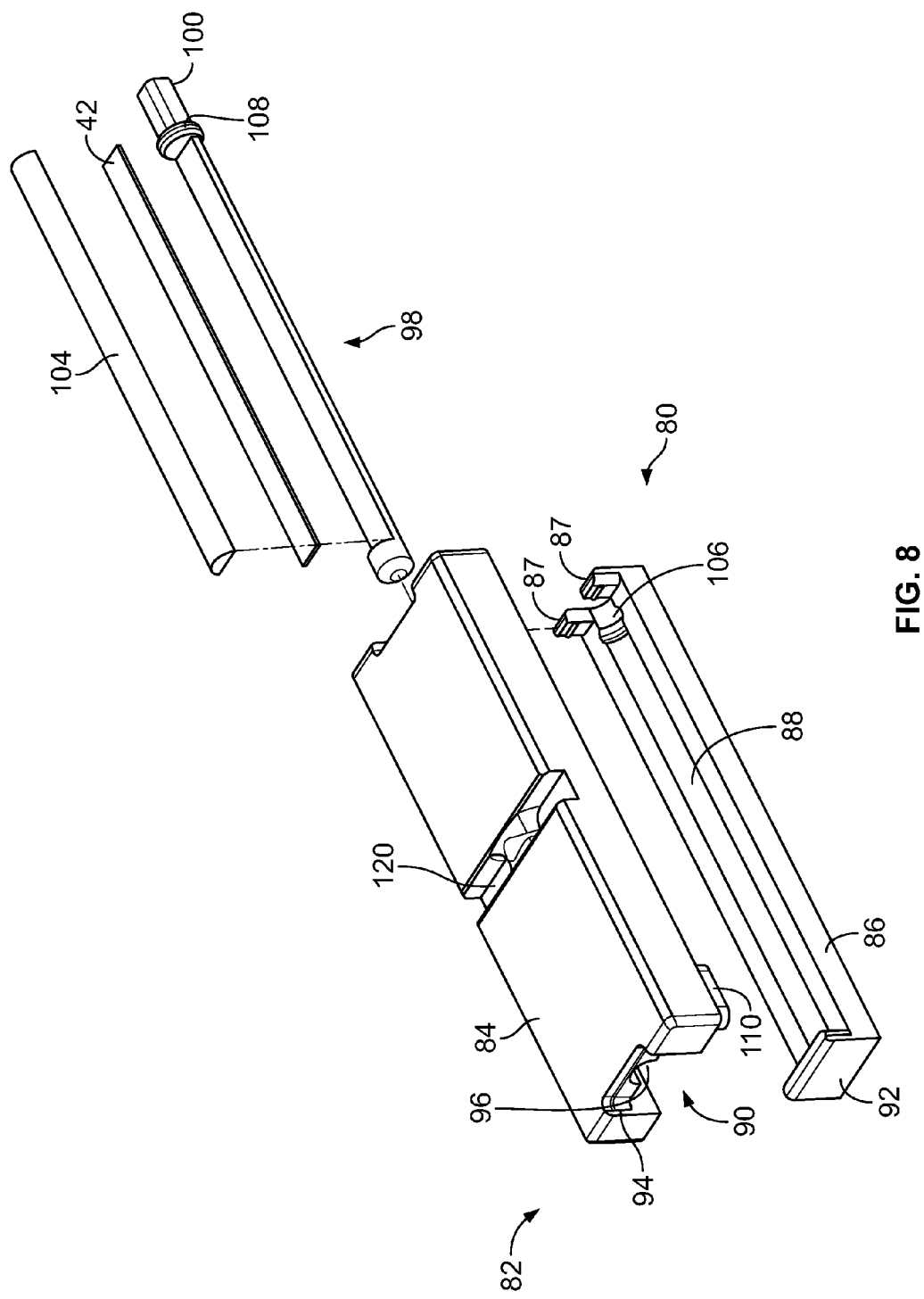
FIG. 8 is an exploded view of an RF trap formed in accordance with another embodiment.

It should be noted that the cover 84 of the RF trap 80 may take different shapes and sizes. Additionally, while the cover 84 (as illustrated in FIG. 8) includes a recess 120 extending transversely across the top of the cover 84, the recess 120 may not be provided in some embodiments.

Figure 12:
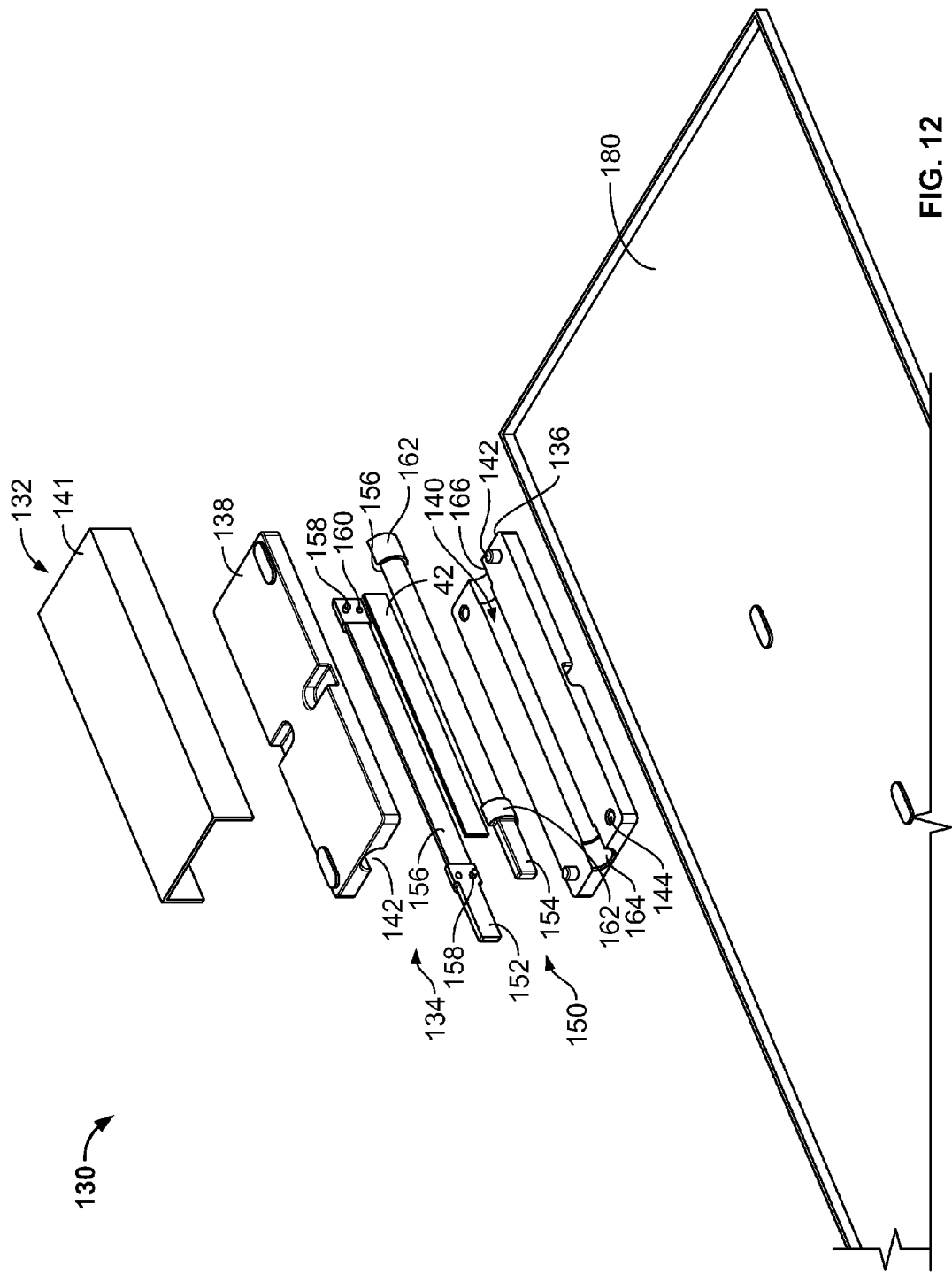
FIGS. 12 and 13 are exploded views of an RF trap formed in accordance with another embodiment.
Figure 13:
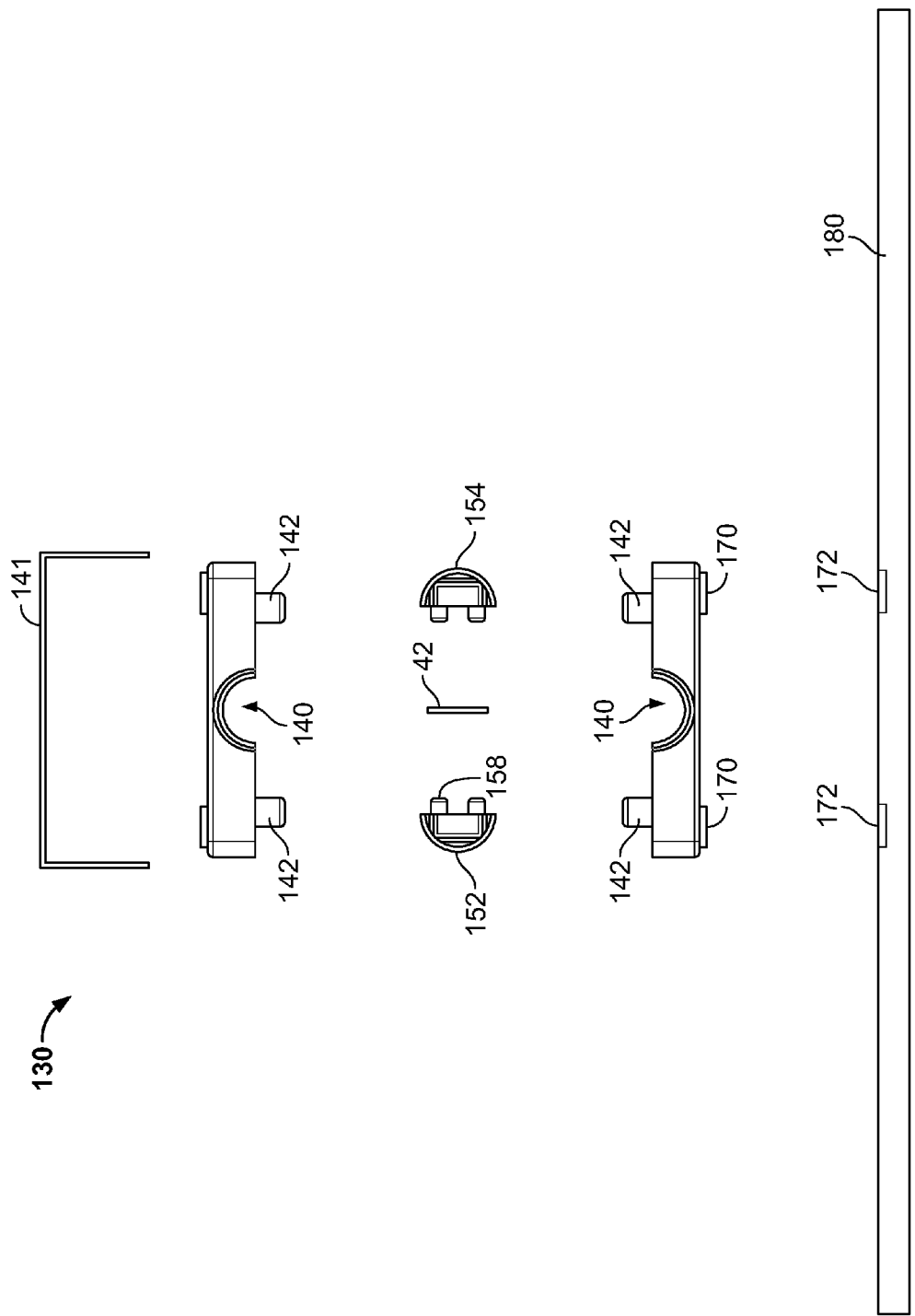

Other variations and modifications are contemplated for the magnetic flux shutter arrangement. For example, FIGS. 12 and 13 illustrate an RF trap 130 which may be used alternatively or in addition to the RF traps 36 and/or 80, for example, in combination with the transmission lines 32 and 34 (shown in FIG. 1). In this embodiment, the RF trap 130 may be configured for positioning adjacent a stripline or microstripline transmission line using a support structure 180. The RF trap 130, similar to the RF traps 36 and 80 allows for rotation of the metallic strip 42 therein. The RF trap 130 is formed as a multi-piece design wherein a body 132 is formed from a shutter holder 134 having a housing shells 136 and 138, which are secured within a cover 141.

More particularly, the housing shells 136 and 138 include complementary channels 140 and 142, respectively, that form a cavity with the housing shells 136 and 138 when the housing shells 136 and 138 are engaged together. The housing shells 136 and 138 may include engagement members 142, illustrated as cylindrical protrusions that are received within complementary recesses 144. For example, each of the housing shells 136 and 138 may include engagement members 142 on two corners and recesses 144 on opposite corners, such that when the housing shells 136 and 138 are brought into abutting engagement, the engagement members 142 of each of the housing shells 136 and 138 are received within the recesses 144 of the other housing shell 136 or 138 to align the housing shells 136 and 138 and form the shutter holder 134.

The shutter holder 134 also includes a rotatable member 150 formed from semi-cylindrical members 152 and 154 that each include a recess 156, such as a cutout or channel for receiving therein the metallic strip 42. The cylindrical members 152 and 154 may include complementary engagement members illustrated as protrusions 158 and recesses 160 to engage and align the semi-cylindrical members 152 and 154 together when received within the housing shells 136 and 138.

The rotatable member 150 is sized and shaped to be inserted and maintained within a cylindrical cavity formed by the two channels 142 and 144, with the metallic strip 42 maintained within the recesses 156. Thus, the semi-cylindrical members 152 and 154 are received within the cylindrical cavity formed by the two channels 142 and 144 such that the metallic strip 42 is secured within the shutter holder 134. The rotatable member 150 includes annular flanges 162 that engage within annular grooves 164 and 166 of the housing shells 136 and 138 in a complementary arrangement when the rotatable member 150 is positioned within the housing shells 136 and 138. In operation, the engagement of the annular flanges 162 within the annular grooves 164 and 166 maintains the rotatable member 150 aligned within the cavity formed by the two channels 140 and 142 of the housing shells 136 and 138 and prevents axial movement of the rotatable member 150 along the longitudinal axis of the RF trap 130. However, this arrangement allows for rotational movement of the rotatable member 150 to position the metallic strip 42 at different angles within the RF trap 130.

Thus, the shutter holder 134 generally forms a cylindrical body that is sized and shaped to be received within the cavity formed by the two channels 142 and 144. The components of the shutter holder 134 may be secured together using an adhesive or may be positioned in an abutting arrangement and positioned within the RF trap 130 without adhesive coupling.

With the housing shells 136 and 138 engaged together having the rotatable member 150 with the metallic strip 42 therein, the cover is positioned over the housing shells 136 and 138 to secure the components together. For example, the cover 141 may be secured to the housing shells 136 and 138 using an adhesive. It should be noted that the cover 141 is sized and shaped, for example, to extend around a top and two sides of the shutter holder 134 (as viewed in FIG. 12). The cover 141 may be removable secured or permanently secured to the shutter holder 134.

Thus, the rotatable member 150 is maintained within the housing shells 136 and 138 and allows rotational movement of the metallic strip 42 therein. The RF trap 130 may include engagement tabs 170 that in the illustrated embodiment protrude or extend from the housing shells 136 and 138 to engage recesses 172, which may be within or coupled to the support structure 180.

It should be noted that the shutter holder may be any type of structure, such as a backer, that supports the metallic strip 42 (e.g., metallic trace), which also may be, for example, a printed circuit board glued to one side of the metallic strip 42 or other rigid or semi-rigid components.

Figure 14:
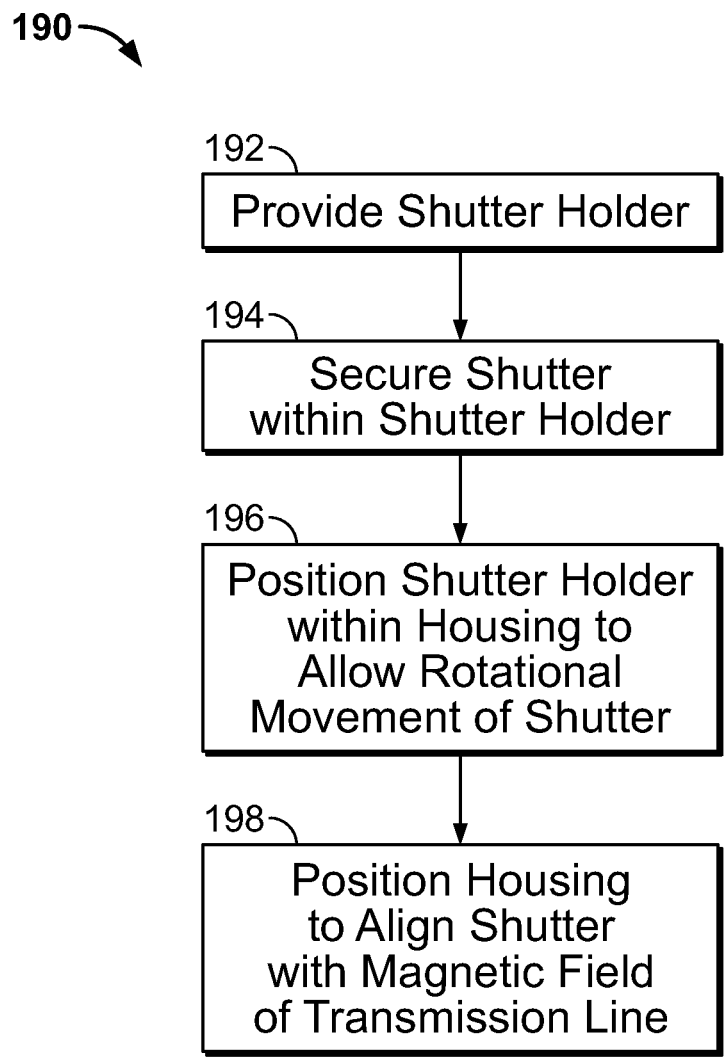
FIG. 14 is a flowchart of a method for providing a magnetic flux shutter arrangement in accordance with various embodiments.

Various embodiments provide a method 190 as shown in FIG. 14 for providing a magnetic flux shutter arrangement. The method includes providing a shutter holder at 192. For example, a plastic holder may be provided having a recess for receiving a magnet flux shutter therein, such as a metallic strip. The magnetic flux shutter is then secured within the shutter holder at 194, for example, secured within the recess of the shutter holder. The shutter holder is then positioned within a housing at 196 such that the shutter holder can rotate within the housing as described in more detail herein. The housing is then positioned at 198, for example, adjacent to a transmission line to align the magnetic flux shutter with a magnetic field, such as a magnetic H-field of a transmission line by rotating the magnetic flux shutter to thereby dampen or block common-mode energy (e.g., induced currents or voltages). For example, the magnetic flux shutter may be rotated within the housing to block the magnetic H-field around a coaxial cable, stripline or microstripline.

Figure 15:
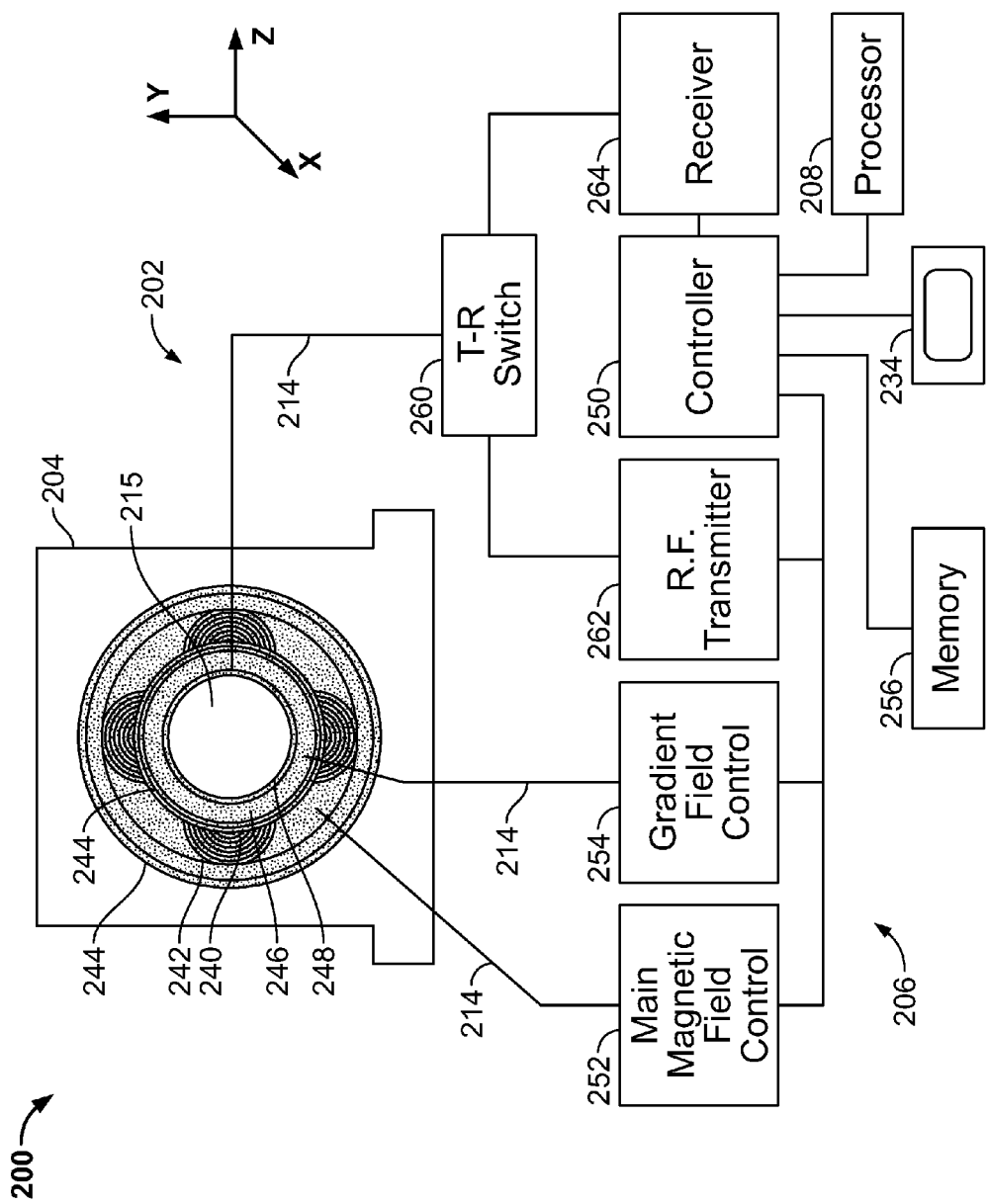
FIG. 15 is a schematic illustration of an exemplary medical imaging system in which various embodiments may be implemented.

Various embodiments of a magnetic flux shutter arrangement may be provided as part of, or used with, a medical imaging system, such as the imaging system 200 shown in FIG. 15. It should be appreciated that although the imaging system 200 is illustrated as a single modality imaging system, the various embodiments may be implemented in or with multi-modality imaging systems. The imaging system 200 is illustrated as an MRI imaging system. Moreover, the various embodiments are not limited to medical imaging systems for imaging human subjects, but may include veterinary or non-medical systems for imaging non-human objects, luggage, etc.

Referring to FIG. 15, the imaging system 200 includes an imaging portion 202 having an imaging unit 204 (e.g., imaging scanner) and a processing portion 206 that may include a processor 208 or other computing or controller device. In particular, the imaging unit 204 enables the imaging system 200 to scan an object or patient to acquire image data, which may be image data of all or a portion of the object or patient. The imaging unit 204 includes one or more imaging components that allow acquisition of image data. The imaging components produce signals that represent image data that is communicated to the processing portion 206 via one or communication links 214 that may be wired or wireless. The patient may be positioned within a bore 215 using, for example, a motorized table and then MR imaging performed as described in more detail herein.

In operation, an output of one or more of the imaging components is transmitted to the processing portion 206, and vice versa, which may include transmitting signals to or from the processor through a control interface, which may be embodied as the system interface 30 (shown in FIG. 1). The processor 208 also may generate control signals for controlling the position of the motorized table and imaging components based on user inputs or a predetermined scan. For example, RF signals or transmit pulses may be communicated through the one or more communication links 214, which may include one or more RF traps as described herein.

During a scan, image data, such as magnetic resonance image data from the imaging components may be communicated to the processor 208 through a data interface via the control interface, for example, as acquired by a body coil or surface coil.

The processor 208 and associated hardware and software used to acquire and process data may be collectively referred to as a workstation. The workstation may include, for example, a keyboard and/or other input devices such as a mouse, a pointer, and the like, and a monitor 234. The monitor 234 displays image data and may accept input from a user if a touchscreen is available.

In the exemplary embodiment, the imaging system 200 also includes a superconducting magnet 240 formed from magnetic coils supported on a magnet coil support structure. However, in other embodiments, different types of magnets may be used, such as permanent magnets or electromagnets. A vessel 242 (also referred to as a cryostat) surrounds the superconducting magnet 240 and is filled with liquid helium to cool the coils of the superconducting magnet 240. A thermal insulation 244 is provided surrounding the outer surface of the vessel 242 and the inner surface of the superconducting magnet 240. A plurality of magnetic gradient coils 246 are provided within the superconducting magnet 240 and an RF transmit coil 248 (which may be embodied as the transmit coil 22) is provided within the plurality of magnetic gradient coils 146. In some embodiments the RF transmit coil 248 may operate as a receive coil. It should be noted that although the superconducting magnet 240 is a cylindrical shape, other shapes of magnets can be used.

The processing portion 206 also generally includes a controller 250, a main magnetic field control 252, a gradient field control 254, a memory 256, the display device 234, a transmit-receive (T-R) switch 260, an RF transmitter 262 and a receiver 264.

In operation, a body of an object, such as the patient or a phantom to be imaged, is placed in the bore 215 on a suitable support, for example, a motorized table or other patient table. The superconducting magnet 240 produces a uniform and static main magnetic field $B_o$ across the bore 215. The strength of the electromagnetic field in the bore 215 and correspondingly in the patient, is controlled by the controller 250 via the main magnetic field control 252, which also controls a supply of energizing current to the superconducting magnet 240.

The magnetic gradient coils 246, which include one or more gradient coil elements, are provided so that a magnetic gradient can be imposed on the magnetic field $B_o$ in the bore 215 within the superconducting magnet 240 in any one or more of three orthogonal directions x, y, and z. The magnetic gradient coils 246 are energized by the gradient field control 254 and are also controlled by the controller 250.

The RF transmit coil 248 is arranged to transmit RF magnetic pulses and/or optionally detect MR signals from the patient if receive coil elements are not provided on the patient. In various other embodiments, the receive coil arrays 24

(shown in FIG. 1) detect the MR signals. The RF transmit coil 248/or receive coil arrays 24 are selectably interconnected to one of the RF transmitter 262 or receiver 264, respectively, by the T-R switch 260. The RF transmitter 262 and T-R switch 260 are controlled by the controller 250 such that RF field pulses or signals that are generated by the RF transmitter 262 are selectively applied to the patient for excitation of magnetic resonance in the patient.

Following application of the RF pulses, the T-R switch 260 is again actuated to decouple the RF transmit coil 248 from the RF transmitter 262. The detected MR signals are in turn communicated to the controller 250. The controller 250 includes a processor (e.g., image reconstruction processor), for example the processor 208, that controls the processing of the MR signals to produce signals representative of an image of the patient.

The processed signals representative of the image are also transmitted to the display device 234 to provide a visual display of the image. Specifically, the MR signals fill or form a k-space that is Fourier transformed to obtain a viewable image. The processed signals representative of the image are then transmitted to the display device 234.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A radio-frequency (RF) trap comprising:
a body having a cavity that extends along a longitudinal axis of the body;
a shutter holder, wherein the shutter holder is disposed within the cavity, the shutter holder having a rotatable member for receiving a magnetic flux shutter, the shutter holder is rotatably coupled within the cavity, the shutter holder configured to rotate within the cavity about the longitudinal axis; and
the magnetic flux shutter inserted into the rotatable member to couple the magnetic flux shutter to the shutter holder, the magnetic flux shutter rotating within the cavity with the shutter holder to align the magnetic flux shutter at an angle within the body.

2. The RF trap of claim 1, wherein the body comprises a cavity receiving the shutter holder therein, the cavity is offset from a central longitudinal axis of the body.

3. The RF trap of claim 1, wherein the shutter holder is coupled within the body in an axially fixed position.

4. The RF trap of claim 1, wherein the shutter holder is configured to rotate 180 degrees within the body.

5. The RF trap of claim 1, wherein the body comprises a base and a cover, each having a channel that together form the cavity.

6. The RF trap of claim 1, wherein the rotatable member has at least one annular flange and the cavity includes at least one annular groove receiving the annular flange therein and allowing rotational movement of the shutter holder within the cavity.

7. The RF trap of claim 1, wherein the shutter holder comprises a base having a recess, the magnetic flux shutter coupled within the recess, and further comprising a cover, the magnetic flux shutter positioned between the base and the cover.

8. The RF trap of claim 7, wherein the shutter holder has a generally cylindrical shape.

9. The RF trap of claim 1, wherein the body comprises an engagement member for engaging a transmission line.

10. The RF trap of claim 1, wherein the body comprises housing shells having recesses, the housing shells coupled together with the recesses forming the cavity.

11. The RF trap of claim 1, wherein the magnetic flux shutter comprises a metallic strip.

12. The RF trap of claim 1, wherein the body cylindrical in shape and having a second cavity configured to receive a coaxial cable therethrough.

13. The RF trap of claim 1, wherein the housing is rectangular in shape and having a cover securing together shell portions forming the shutter holder.

14. A magnetic resonance imaging (MRI) system comprising:
an imaging portion having at least one transmit coil;
a processing portion;
a system interface interconnecting the imaging portion and the processing portion, the system interface connected to the at least one transmit coil with at least one transmission line; and
a radio-frequency (RF) trap positioned adjacent the at least one transmission line, the RF trap having a body, the body having a cavity that extends along a longitudinal axis of the body, a shutter holder that includes a rotatable member for receiving a magnetic flux shutter, the shutter holder disposed within the cavity and rotatably coupled within the cavity, the shutter holder configured to rotate within the body about the longitudinal axis, and a magnetic flux shutter inserted into the rotatable member and coupled to the shutter holder, wherein the magnetic flux shutter rotating within the cavity with the shutter holder to align the magnetic flux shutter at an angle within the body and configured to dampen currents induced along the at least one transmission line.

15. The MRI system of claim 14, wherein the body comprises a cavity receiving the shutter holder therein, the cavity is offset from a central longitudinal axis of the body.

16. The MRI system of claim 14, wherein the body comprises a base and a cover, each having a channel that together form the cavity, wherein the rotatable member having at least one annular flange and the cavity includes at least one annular groove receiving the annular flange therein and allowing rotational movement of the shutter holder within the cavity.

17. The MRI system of claim 14, wherein the shutter holder comprises a base having a recess, the magnetic flux shutter coupled within the recess, and further comprising a cover, the magnetic flux shutter positioned between the base and the cover and wherein the shutter holder has a generally cylindrical shape and the body includes a generally cylindrical cavity with the shutter holder coupled therein.

18. The MRI system of claim 14, wherein the transmission line comprises a coaxial cable.

19. The MRI system of claim 14, wherein the transmission line comprises a stripline.

20. A method for providing a magnetic flux shutter arrangement, the method comprising:
    providing a shutter holder, wherein the shutter holder includes a rotatable member for receiving a magnetic flux shutter;
    securing the magnetic flux shutter within the rotatable member; and
    positioning the shutter holder within a cavity of a housing to allow rotational movement of the magnetic flux shutter therein.

21. The method of claim 20 further comprising positioning the housing to align the magnetic flux shutter with a magnetic field of a transmission line by rotating the magnetic flux shutter with the shutter holder.

* * * * *